United States Patent
Kao et al.

(10) Patent No.: US 6,723,168 B2
(45) Date of Patent: Apr. 20, 2004

(54) SPIN-COATER WITH SELF-CLEANING CUP AND METHOD OF USING

(75) Inventors: Yao-Hwan Kao, Hsin-chu (TW); Yi-Chuan Lo, Hsin-chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 142 days.

(21) Appl. No.: 09/885,715

(22) Filed: Jun. 20, 2001

(65) Prior Publication Data
US 2002/0197400 A1 Dec. 26, 2002

(51) Int. Cl.[7] .................................................. B05C 5/00
(52) U.S. Cl. .................... 118/52; 118/326; 427/240; 427/425
(58) Field of Search ................. 118/52, 326, 301; 427/240, 425

(56) References Cited

U.S. PATENT DOCUMENTS 5,439,519 A * 8/1995 Sago et al. ................... 118/52
5,529,626 A * 6/1996 Stewart ...................... 118/500
5,540,772 A * 7/1996 McMillan et al. ............ 118/50
6,197,385 B1 * 3/2001 Takeshita et al. ........... 427/425
6,270,576 B1 * 8/2001 Araki et al. .................. 118/52

* cited by examiner

Primary Examiner—Richard Crispino
Assistant Examiner—Michelle Acevedo Lazor
(74) Attorney, Agent, or Firm—Tung & Associates

(57) ABSTRACT

A spin-coater for coating a liquid material on a wafer that is equipped with a self-cleaning coating cup and a method for self-cleaning a spin-coater are described. The spin-coater is constructed of a coating cup of circular shape, a wafer pedestal situated in the cup, a coating material dispensing nozzle over the pedestal, a motor means for rotating the pedestal, and a solvent dispensing means that is mounted juxtaposed to an upper rim of the sidewall of the cup for dispensing a cleaning solvent onto an interior surface of the sidewall to dissolve and rinse off any liquid coating material splattered thereon and to prevent the formation of solid contamination from the solidified coating material.

8 Claims, 2 Drawing Sheets

SPIN-COATER WITH SELF-CLEANING CUP AND METHOD OF USING

FIELD OF THE INVENTION

The present invention generally relates to a spin-coater and a method of using and more particularly, relates to a spin-coater that is equipped with a self-cleaning cup for preventing the deposition and accumulation of solidified coating material on an interior surface of the coating cup and a method of using.

BACKGROUND OF THE INVENTION

In the manufacturing processes for integrated circuits, a lithography process is frequently used for reproducing circuits and structures on a semiconductor substrate. As a first step in a lithography process, a photoresist layer is first coated onto a semiconductor substrate such that an image can be projected and developed on the substrate. The photoresist material is a liquid that is coated in a very thin layer on top of the semiconductor substrate. In a conventional process for applying a photoresist coating material to a semiconductor substrate, a spin coating apparatus is normally used. The spin coating apparatus is a sealed chamber constructed by an upper compartment, a lower compartment and a circular-shaped, rotating platform that has a diameter slightly smaller than the diameter of a semiconductor substrate. The rotating platform is a vacuum chuck since vacuum is applied to the platform for holding the semiconductor substrate securely during a spin coating process. The rotating platform is positioned in the coating machine such that a semiconductor substrate may be placed on top horizontally. During the coating process, the bottom or the uncoated surface of a semiconductor substrate contacts the rotating platform. A suitable vacuum is then applied to the bottom surface of the substrate such that it stays securely on the vacuum chuck even at high rotational speed. The rotating motion of the vacuum chuck is achieved by a shaft which is connected to the vacuum chuck and powered by a motor.

In a typical photoresist coating process, a desirable amount of a liquid photoresist material is first applied to a top surface of the semiconductor substrate from a liquid dispenser that is mounted on a track while the substrate is rotated at a low speed on the vacuum chuck. The photoresist liquid spread radially outward from the center of the semiconductor substrate where it is applied towards the edge of the semiconductor substrate until the entire top surface of the substrate is covered with a thin layer. Excess photoresist liquid spun off the rotating wafer during the photoresist coating process. The rotational speed of the vacuum chuck and the amount of the photoresist liquid applied at the center of the semiconductor substrate can be determined and adjusted prior to and during an application process such that a predetermined, desirable thickness of the photoresist is obtained. The rotational speed of the vacuum chuck is normally increased at the end of the application process to ensure that the entire surface of the substrate is evenly coated with the photoresist material.

A typical process flow chart illustrating a spin coating process 10 is shown in FIG. 1. In a conventional deposition process 10, a liquid material is first dispensed in step 12 by depositing a predetermined amount of liquid at or near the center of the wafer. The amount of the liquid can be suitably controlled by adjusting the flow rate through a dispensing nozzle from which the liquid is dispensed. The flow rate can, in turn, be controlled by a pressure existing in a liquid reservoir tank.

The wafer turns on a wafer pedestal at a rotational speed between 2000 and 3000 rpm when the liquid material is dispensed at the center of the wafer. The liquid material is then spun-out in step 14 by centrifugal forces from the center toward the edge of the wafer uniformly over the entire wafer surface. After all the liquid material is spun-out and the edge of the wafer is fully covered, the solvent contained in liquid has at least partially vaporized and form a solid coating on the wafer surface. After the spin-out step 14 is completed, an edge bead rinse process of step 16 is carried out at the edge of the wafer surface, i.e. an area of approximately 2—3 mm from the edge of the wafer, to wash away material deposited at such area. At this stage of the process, the material has mostly solidified and thus the edge bead rinse process is not always effective. After the edge bead rinse step 16, the backside of the wafer is rinsed by a different jet of cleaning solvent to wash away any material deposited at undesirable locations. This is shown as step 18 in FIG. 1. The wafer is then spun-dry in step 20 to complete the coating process.

A typical apparatus 22 for coating photoresist on a semiconductor substrate is shown in FIG. 2. The apparatus 22 consists of a drain cup 28 and a rotating platform 30, i.e. a vacuum chuck, positioned at the center of the drain cup for supporting a semiconductor wafer 26 on a top surface 24 of the vacuum chuck 20. The vacuum chuck can be rotated by a shaft 32 which is connected to an electric motor (not shown). The drain cup 28 is provided with a spent photoresist drain pipe 34. The spent photoresist drain pipe 34 is used to drain away photoresist liquid that spun off the substrate during a coating operation.

In the operation of the conventional spin coater 22 of FIG. 2, the rotating platform 30 is first loaded with a semiconductor wafer 26 on top. A liquid dispenser 18 then approaches the center of the wafer 26 and applies a predetermined amount of a liquid photoresist material to the center of the substrate. The rotating platform 30 then spins to spread out the photoresist material to evenly cover the top surface of the wafer 26. Extra photoresist material 36 is thrown off the substrate surface and drained away by the drain pipe 34.

In the conventional spin-coating process of FIG. 1 utilizing the apparatus of FIG. 2, the process results in a significant waste of the coating material since a large amount of the liquid coating material is thrown off the wafer surface during wafer spinning. The liquid coating material thrown off the wafer surface adheres to an interior surface of the cup sidewall and thus forming a donut-shaped ring of solidified photoresist material on the interior surface of the sidewall. The solidified photoresist material becomes a major source of particle contamination during subsequent coating processes for the photoresist. Moreover, the solid particles of the photoresist material may also cause a blockage of a drain pipe that is normally located at a bottom wall of the cup for draining away the liquid coating material. It is a difficult task for un-blocking or cleaning the drain pipe to ensure a free flow of the spent photoresist material.

It is therefore an object of the present invention to provide a spin-coater for coating a liquid material on a wafer that does not have the drawbacks or shortcomings of the conventional spin-coaters.

It is another object of the present invention to provide a spin-coater for coating a liquid material on a wafer that is equipped with a self-cleaning coating cup.

It is a further object of the present invention to provide a spin-coater for coating a liquid material on a wafer wherein the coating cup is equipped with a solvent dispensing means.

It is another further object of the present invention to provide a spin-coater for coating a liquid material on a wafer wherein the coating cup is equipped with a solvent dispensing tube for dispensing a cleaning solvent onto an interior surface of a sidewall of the cup.

It is still another object of the present invention to provide a spin-coater for coating a liquid material on a wafer wherein the coating cup is equipped with a plurality of spray nozzles for spraying a cleaning solvent onto an interior surface of a sidewall of the cup.

It is yet another object of the present invention to provide a method for self-cleaning a spin-coater such that any accumulation of solidified coating material on an interior surface of the cup can be avoided.

It is still another further object of the present invention to provide a method for self-cleaning a spin-coater by mounting a solvent dispensing means on the coater sidewall and spraying an interior surface of the sidewall with a clearing solvent.

SUMMARY OF THE INVENTION

In accordance with the present invention, a spin-coater for coating a liquid material on a wafer equipped with a self-cleaning cup and a method for self-cleaning a spin-coater are provided.

In a preferred embodiment, a spin-coater equipped with a self-cleaning cup can be provided which includes a cup of circular shape formed by a sidewall and a bottom wall, the cup has an open top and a drain pipe through a bottom wall of the cup; a wafer pedestal situated inside the cup adapted for holding and rotating a wafer to be coated thereon; a dispensing nozzle suspended over the wafer pedestal for dispensing a liquid coating material on top of the wafer; a motor means for rotating the wafer pedestal at a preset rotational speed; and a solvent dispensing means mounted juxtaposed to an upper rim of the sidewall for dispensing a cleaning solvent on an interior surface of the sidewall to dissolve and rinse off any formation of solid contaminating particles from the splattered liquid coating material.

In the spin-coater equipped with a self-cleaning cup, the solvent dispensing means includes a solvent dispensing tube that has a plurality of apertures for dispensing the cleaning solvent, or a plurality of spray nozzles for spraying the cleaning solvent, or a plurality of spray nozzles and a solvent supply tube for delivering the cleaning solvent to the plurality of spray nozzles. The solvent dispensing means may include a solvent dispensing tube that is formed of stainless steel, or formed of Teflon. The cup of circular shape may be formed of stainless steel. The spin-coater may further include a waste solvent collection tank for collecting spent solvent from the drain pipe.

The present invention is further directed to a method for self-cleaning a spin-coater which can be carried out by the operating steps of providing a cup of circular shaped formed by a sidewall and a bottom wall, the cup has an open top and a drain pipe through the bottom wall of the cup; providing a wafer pedestal inside the cup for holding a wafer thereon; mounting a solvent dispensing means juxtaposed to an upper rim of the cup; positioning a wafer on the wafer pedestal with an active surface to be coated exposed; conducting a coating process on the active surface of the wafer; removing the wafer with the active surface coated from the cup; and dispensing a cleaning solvent onto an interior surface of the sidewall to remove any splattered coating material through the solvent dispensing means.

The method for self-cleaning a spin-coater may further include the step of mounting a solvent dispensing tube that has a plurality of apertures therethrough juxtaposed to an upper rim of the sidewall of the cup, or the step of mounting a plurality of spray nozzles for spraying a cleaning solvent therethrough juxtaposed to an upper rim of the sidewall of the cup. The method may further include the step of flowing a cleaning solvent through a conduit to the solvent dispensing means. The method may further include the step of rinsing off residual liquid coating material from the interior surface of the sidewall, or the step of dissolving solidified coating material from the interior surface of the sidewall. The method may further include the step of collecting spent solvent into a waste solvent tank from the drain pipe positioned in the cup. The method may further include the step of loading a second wafer onto the wafer pedestal after the sidewall cleaning process. The method may further include the step of forming the solvent dispensing tube in a circular shape for fitting onto the upper rim of the cup, or the step of forming the solvent dispensing tube in stainless steel, or the step of forming the solvent dispensing tube in Teflon, or the step of forming the plurality of spray nozzles in stainless steel.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
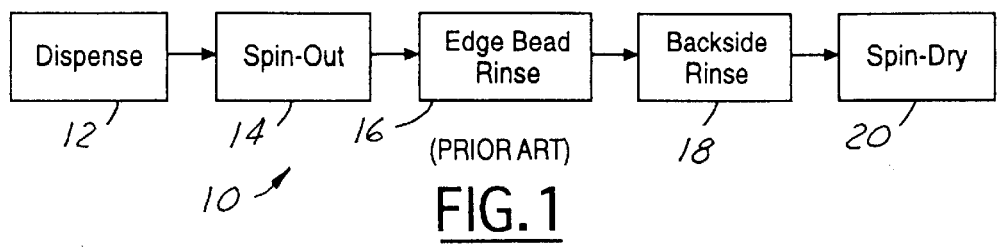
FIG. 1 is a process flow chart for a conventional spin-coating process on a wafer.
Figure 2:
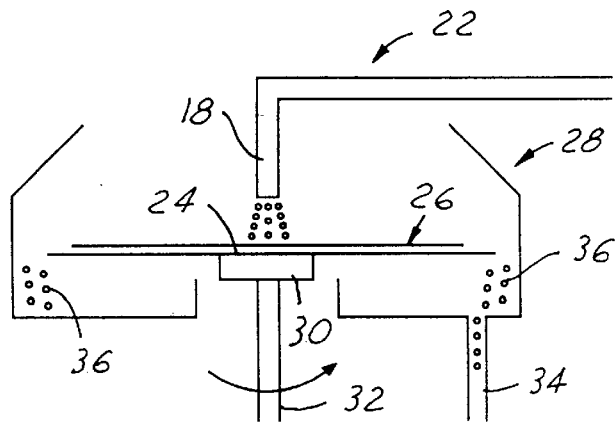
FIG. 2 is a cross-sectional view of a conventional spin-coater utilized in spin-coating a liquid.

The invention discloses a spin-coater that is equipped with a self-cleaning cup and a method for self-cleaning a spin-coater.

In the spin-coater that is equipped with a self-cleaning cup, the coater is constructed by a cup of circular shape, a wafer pedestal inside the cup, a coating dispensing nozzle over the wafer pedestal, a motor means for turning the pedestal, and a solvent dispensing means. The solvent dispensing means is mounted immediately adjacent to an upper rim of a sidewall of the coating cup for dispensing a cleaning solvent on an interior surface of the sidewall such that any liquid coating material splattered on the sidewall can be dissolved and rinsed off to prevent the formation of solid contaminating particles from the splattered liquid coating material. The coating cup is further provided with a drain pipe through a bottom of the cup for draining away spent cleaning solvent from the cup.

The invention is further directed to a method for self-cleaning a spin-coater used for coating a liquid material on a wafer. The method can be carried out by first providing a coating cup that has a wafer pedestal situated inside for holding a wafer, then mounting a solvent dispensing means immediately adjacent to an upper rim of the cup, then positioning a wafer on the pedestal and conducting a coating process on the wafer, then removing the wafer from the coating cup, and dispensing a cleaning solvent onto an interior surface of the sidewall to remove any splattered coating material through the solvent dispensing means. The method may further include the step of rinsing off residual liquid coating material from the interior surface of the sidewall, or the step of dissolving solidified coating material from the interior surface of the sidewall.

The present invention novel apparatus and method improves greatly over the current spin-coater wherein a coating cup is easily contaminated by dry photoresist material and thus becoming a major source of solid particle contamination. The coated dry photoresist film on an interior surface of the coating cup causes splatter of the liquid coating material and the formation of a donut-type shape solid deposition. The dry photoresist material or powder on the sidewall further causes blockage of an exhaust drain pipe which may be very difficult to clean. The present invention novel apparatus eliminates the need for frequent replacement of the coating cup for cleaning purpose, and thus reduces fabrication costs and improves throughput.

The present invention novel spin-coater equipped with the solvent dispensing means may utilize a cleaning solvent dispensing tube that is mounted immediately adjacent to an upper rim of a sidewall of the cup for dispensing a cleaning solvent to dissolve and rinse off any liquid coating material splattered on the sidewall surface. The novel spin-coater may further be equipped with a solvent dispensing means that is a plurality of spray nozzles mounted on an upper rim of the sidewall for spraying a cleaning solvent onto an interior surface of the sidewall to dissolve and rinse off liquid coating material splattered thereon. A solvent supply conduit may be used to flow a pre-determined quantity of cleaning solvent to the solvent dispensing means for such cleaning.

The invention method may utilize a solvent cleaning tube that is provided with a plurality of apertures and mounted on top of the sidewall of the coating cup. When a coated wafer is removed from the coating cup, the solvent dispensing tube will flow a cleaning solvent down the interior surface of the sidewall to clean the sidewall and to drain away spent cleaning solvent into a waste solvent collection tank. When a wafer is transferred into the coating cup for performing a coating process thereon and when the chuck vacuum is turned on to hold the wafer, the cleaning solvent flow stops to prevent any influence on the coating uniformity.

Figure 4:
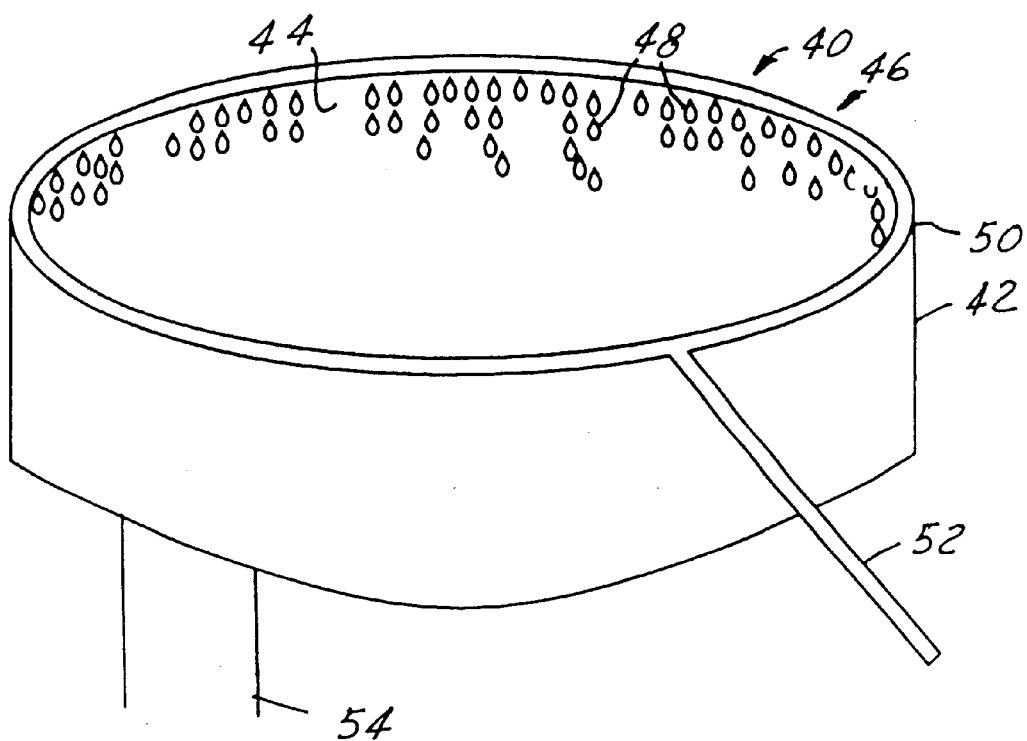
FIG. 4 is a perspective view of the coating cup for the present invention spin-coater equipped with a solvent dispensing means.

Referring now to FIG. 4 wherein a present invention coating cup 40 is shown. The coating cup 40 has a sidewall 42 that has an interior surface 44. A solvent dispensing means 46 in the form of a circular dispensing tube is mounted on top of the sidewall 42 by a suitable mechanical means, such as by clips (not shown). The solvent dispensing tube 46 is provided with a multiplicity of apertures (not shown) along the full length of the tube such that droplets or small stream 48 of a cleaning solvent may flow down the interior surface 44 of the sidewall 42 to rinse off any residual coating material deposited, or splattered thereon.

While not shown in FIG. 4, the cleaning solvent dispensing means may also be provided in a plurality of solvent spray nozzles that are mounted equally spaced-apart on the top rim 50 of the sidewall 42 with the opening of the nozzle aiming downwardly toward the interior surface 44. In one embodiment, at least six spray nozzles are utilized to cover the entire interior surface 44 of the sidewall 42. The spray of the cleaning solvent is accomplished by a fan-shaped spray patterned such that each nozzle may cover a wide area of the interior surface 44.

A solvent supply conduit 52 is further used for supplying a flow of cleaning solvent to the solvent dispensing means 46, or to the plurality of spray nozzles. In a preferred embodiment, the flow rate of the solvent such as isopropanol or acetone may flow at a flow rate of between about 2 ml/min and about 20 ml/min. The word about used in this writing indicates a range of values that is ±10% of the average value given.

The drain pipe 54 removes spent cleaning solvent from a bottom of the coating cup 40 to a waste solvent storage tank (not shown).

As shown in FIG. 4, the solvent dispensing means of the dispensing tube 46 may be suitably fabricated of a material that is chemical resistant, such as stainless steel or Teflon. The coating cup 40 is frequently fabricated of stainless steel.

Figure 3:
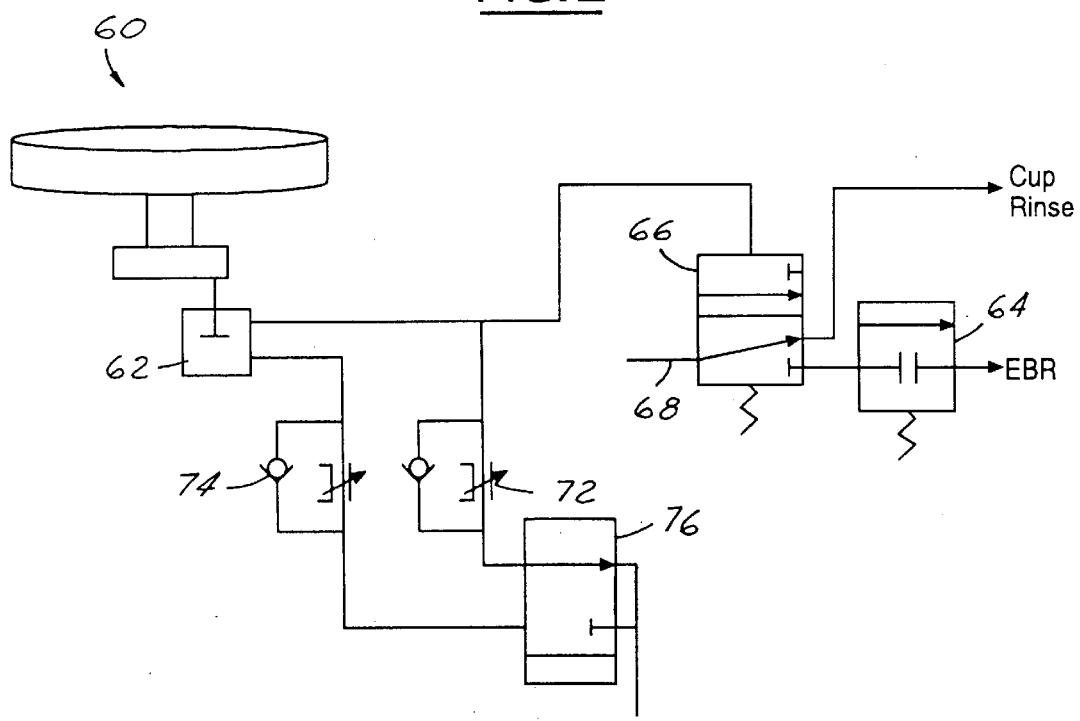
FIG. 3 is a circuit control diagram for the present invention self-cleaning spin-coater.

The present invention novel method for self-cleaning a spin-coater may be carried out according to a schematic of a circuit diagram shown in FIG. 3. The spin chuck or wafer pedestal 60 is operated by an air cylinder 62. When the air cylinder is in a down position, a wafer (not shown) positioned on the pedestal 60 is being coated with a layer of photoresist material and therefore, the coating cup rinse process cannot be carried out. The control circuit therefore connects to edge bead rinse (EBR) 64. On the other hand, when the air cylinder 62 is in an up position, the spin-coater is in an idle cycle, and therefore the coating cup rinse process is carried out through circuit 66 by inputting a cleaning solvent through conduit 68 to the coating cup rinse line 70. The air-controlled valve 66 is added in the present invention novel apparatus for switching the cleaning solvent line to the coating cup rinse line 70. The speed controller 72, 74 are further utilized and are controlled by the solenoid valve 76 for the up and down motion of the wafer pedestal 60 by operating air cylinder 62.

The present invention novel spin-coater equipped with a self-cleaning coating cup and the method for self-cleaning a spin-coater have therefore been amply described in the above description and in the appended drawings of FIGS. 3 and 4.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A spin-coater equipped with a self-cleaning cup comprising:

a cup of circular shape formed by a sidewall and a bottom wall, said cup having an open top and a drain pipe through said bottom wall of the cup;

a wafer pedestal situated inside the cup adapted for holding and rotating a wafer to be coated inside the cup;

a dispensing nozzle situated over said wafer pedestal for dispensing a liquid coating material on top of said wafer;

a motor means for rotating said wafer pedestal at a preset rotational speed; and a solvent dispensing means mounted on an upper rim of said sidewall for dispensing a cleaning solvent on an interior surface of said sidewall to dissolve and rinse off any liquid coating material splattered thereon and to prevent the formation of solid contaminating particles from said splattered liquid coating material.

2. A spin-coater equipped with a self-cleaning cup according to claim 1, wherein said solvent dispensing means comprises a solvent dispensing tube having a plurality of apertures for dispensing said cleaning solvent.

3. A spin-coater equipped with a self-cleaning cup according to claim 1, wherein said solvent dispensing means comprises a plurality or spray nozzles for spraying said cleaning solvent.

4. A spin-coater equipped with a self-cleaning cup according to claim 1, wherein said solvent dispensing means comprises a plurality of spray nozzles and a solvent supply tube for delivering said cleaning solvent to the plurality of spray nozzles.

5. A spin-coater equipped with a self-cleaning cup according to claim 1, wherein said solvent dispensing means comprises a solvent dispensing tube formed of stainless steel.

6. A spin-coater equipped with a self-cleaning cup according to claim 1, wherein said solvent dispensing means comprises a solvent dispensing tube formed of teflon.

7. A spin-coater equipped with a self-cleaning cup according to claim 1, wherein said cup of circular shape is formed of stainless steel.

8. A spin-coater equipped with a self-cleaning cup according to claim 1 further comprising a waste solvent tank for collecting spent solvent from the drain pipe.

* * * * *